United States Patent [19]

Kawaguchi

[11] Patent Number: 5,131,141
[45] Date of Patent: Jul. 21, 1992

[54] METHOD FOR PREPARING A DOUBLE-SIDED FLEXIBLE CIRCUIT BOARD WITH ELECTRICAL CONNECTION AT A THROUGH-HOLE

[75] Inventor: Toshiyuki Kawaguchi, Saitama, Japan

[73] Assignee: Shin-Etsu Polymer Co., Ltd., Tokyo, Japan

[21] Appl. No.: 616,757

[22] Filed: Nov. 16, 1990

Related U.S. Application Data

[63] Continuation of Ser. No. 385,575, Jul. 26, 1989, abandoned.

Foreign Application Priority Data

[30] Aug. 31, 1988 [JP] Japan .................. 63-217728

[51] Int. Cl.⁵ .............. H05K 3/40; H05K 3/12; H05K 3/42
[52] U.S. Cl. ............................ 29/853; 427/96; 428/901
[58] Field of Search ........ 156/148, 253; 428/901, 428/139; 174/257, 259, 256, 250; 29/845, 849, 848, 432, 432.1, 432.2, 853; 264/154, 155; 427/96, 97, 384, 393.5

[56] References Cited

U.S. PATENT DOCUMENTS

| | | | |
|---|---|---|---|
| 3,037,265 | 6/1962 | Kollmeier | 29/849 |
| 3,864,892 | 2/1975 | Molvar | 156/583.1 X |
| 4,425,263 | 1/1984 | Nazarenko | 252/514 X |
| 4,624,801 | 11/1986 | Kawaguchi et al. | 252/514 X |
| 4,707,213 | 11/1987 | Mohr et al. | 156/69 X |

FOREIGN PATENT DOCUMENTS

| | | |
|---|---|---|
| 0146061 | 6/1985 | European Pat. Off. . |
| 0228694 | 7/1987 | European Pat. Off. . |
| 57-19876 | 4/1982 | Japan . |
| 58-20158 | 4/1983 | Japan . |
| 60-208888 | 10/1985 | Japan . |
| 60-208894 | 10/1985 | Japan . |
| 1077867 | 8/1967 | United Kingdom . |
| 1474795 | 5/1977 | United Kingdom . |

*Primary Examiner*—Jeff H. Aftergut
*Attorney, Agent, or Firm*—McAulay Fisher Nissen Goldberg & Kiel

[57] ABSTRACT

The invention provides a reliable and productive method for the preparation of a double-sided flexible circuit board having two circuit patterns on the two surfaces of a flexible base film in which the two circuit patterns are electrically connected through an opening penetrating the base film. Different from conventional methods in which the electrical connection between two circuit patterns is obtained by filling the opening with an electroconductive paste, the electrical connection in the invention is obtained by (a) forming a first circuit pattern on one surface with a conductive paste which is then brought into a semi-cured condition, (b) punching the conductive layer and the base film with a needle to make an opening whereby the conductive layer is plastically deformed and protruded on the opposite surface through the opening and (c) providing the opposite surface with the second circuit pattern by printing so that the layer of the second circuit pattern can be in contact with the protruded portion of the first conductive layer.

6 Claims, 1 Drawing Sheet

METHOD FOR PREPARING A DOUBLE-SIDED FLEXIBLE CIRCUIT BOARD WITH ELECTRICAL CONNECTION AT A THROUGH-HOLE

This is a continuation of application Ser. No. 385,575, filed Jul. 26, 1989 now abandoned.

BACKGROUND OF THE INVENTION

The present invention relates to a method for the preparation of a double-sided flexible circuit board with electrical connection between the printed circuit patterns on both surfaces of a substrate at a through-hole or an opening penetrating the substrate. More particularly, the invention relates to a convenient and very reliable method for the preparation of a double-sided flexible circuit board having two circuit patterns printed with an electroconductive paste on both surfaces of a flexible substrate and electrically connected by way of a through-hole formed in the substrate. Such a double-sided circuit board is referred to as a circuit board with through-hole hereinbelow.

Double-sided circuit boards with through-hole are manufactured conventionally by punching a rigid circuit board provided on one surface with a completed circuit pattern to form a through-hole and then providing an electroconductive coating layer on and around the through-hole by applying a conductive paint or by metal-plating followed by forming another circuit pattern on the other surface of the substrate board. This method has several problems including breaking of wiring and troubles in the coating or plating process which is usually complicated and sometimes causes environmental pollution.

A method is proposed in Japanese Patent Publication 57-19876 according to which a flexible resin film as a substrate provided with a circuit pattern on one surface by printing is punched to make an opening having a diameter of 0.1 to 2 mm and the peripheral or side surface of the opening is coated with an electroconductive paste followed by printing of a circuit pattern on the other surface of the substrate film by the method of screen printing to establish electric conduction between two circuit patterns on the surfaces by means of the conductive paste on the side surface of the opening. An improvement of this method is proposed in Japanese Patent Publication 58-20158 according to which the side surface of the opening coated with the conductive paste is overcoated with another conductive paste of a relatively low viscosity with an object to improve the reliability of electric conduction via the side surface of the opening.

Alternatively, Japanese Patent Kokai 60-208888 proposes a method for the preparation of a flexible circuit board with through-hole, according to which a base film as the substrate provided on one surface with a circuit pattern by printing is punched from the other surface to make an opening which is filled with a conductive paste injected at the surface without the circuit pattern. Further, Japanese Patent Kokai 60-208894 proposes a method in which a base film as the substrate provided on one surface with a first circuit pattern by printing is provided with an opening which is filled with a conductive paint and then a second circuit pattern is formed on the other surface of the substrate by using a conductive paint.

The above described prior art methods are each a method in which an opening formed in the substrate is filled or coated with an electroconductive paste or paint so that the reliability of the method largely depends on the viscosity or rheological properties of the paste or paint sometimes requiring repetition of the filling or coating works with the paste or paint. When an excessively large volume of the conductive paste or paint is injected into the opening, moreover, the extraneous portion of the paste or paint necessarily overflows out of the opening to badly contaminate the surface of the substrate film resulting in failure of the electric insulation.

SUMMARY OF THE INVENTION

The present invention accordingly has an object to provide a method for the preparation of a double-sided flexible circuit board with electrical connection between the printed circuit patterns on both surfaces of a substrate at a through-hole or an opening penetrating the substrate without the above described disadvantages and problems in the prior art methods.

Thus, the method of the present invention for the preparation of a double-sided flexible circuit board with through-hole comprises the steps of:

(a) forming an electroconductive patterned layer of a first electric circuit on one surface of a flexible base film, the material of the circuit pattern formed on the base film being electrically conductive and plastically deformable;

(b) thrusting a punching needle into the conductive layer from the surface thereof to penetrate the base film forming an opening in the base film with plastic deformation thereof so that the plastically deformable layer of the first circuit pattern on the base film at the opening is exposed through the opening to the surface of the base film opposite to the first circuit pattern; and (c) forming an electroconductive patterned layer of a second electric circuit on the surface of the base film opposite to the first circuit pattern with an electroconductive plastically deformable material for the pattern formation by printing. the conductive layer of the second circuit pattern being in contact with the conductive layer of the first circuit pattern at the portion exposed through the opening to be electrically connected thereto.

In step (b) of the inventive method, punching of the base film by thrusting a punching needle is performed preferably by putting the base film with the conductive patterned layer facing upwardly on a rubber pad having a thickness of 2 to 5 mm and made of a rubber having a hardness of 30 to 60 by the JIS A scale. It is further preferable that the resinous binder ingredient of the electroconductive plastically deformable layers is a thermosetting resin which is cured by heating subsequent to step (c).

DETAILED DESCRIPTION OF THE PREFERRED EMBODIMENTS

As is described above, the most characteristic feature of the inventive method consists in that the electric connection between two circuit patterns on the two surfaces of a flexible base film is obtained not by filling the opening or through-hole in the base film with an electroconductive paste or paint but obtained by the plastic deformation of the electroconductive patterned layer forming the first electric circuit on one surface of the base film protruded to the other surface of the base film through the opening formed by thrusting a punching needle.

The material of the flexible base film is not particularly limitative and selected from organic polymers having heat resistance and adequate plastic deformability. Examples of suitable polymers include polyester resins, polyimide resins, polycarbonate resins, poly(phenylene sulfide) resins and the like, of which polyester resins are preferred in respects of availability and low costs. In view of the plastic deformability thereof by punching in step (b) of the inventive method, the base film should have a relatively small thickness not exceeding 50 μm or, preferably, not exceeding 30 μm but at least 15 μm.

The electroconductive plastically deformable patterned layer of the first electric circuit is formed, for example, by printing with an electroconductive paste. This patterned layer should be plastically deformed together with the base film by the stress when the punching needle is thrusted thereinto to make an opening. It is preferable that a shearing stress is produced in the base film by the stress or heat of friction when the punching needle is thrusted into the base film to cause a plastic flow of the conductive layer so that the end portion of the conductive layer broken by the needle is slightly protruded on the surface opposite to the surface provided with the first circuit pattern. Such an electroconductive paste can be obtained by compounding a pasty binder resin such as polyester resins, polyurethane resins, epoxy resins and the like with an electroconductive powdery material such as carbon black, silver powder and the like in an amount of 40 to 95% by weight. The electroconductive paste should have a specific resistance of $10 \times 10^{-3}$ to 10 ohm.cm. When a thermoplastic resin is used as the binder of the electroconductive paste, the conductive layer of the circuit pattern can readily be deformed plastically by the shearing stress together with the base film so as to be protruded on the other surface of the base film. When a thermosetting resin is used as the binder, the conductive paste forming the circuit pattern is first solidified by evaporating the solvent followed by punching with a needle to cause protrusion of the conductive layer on the other surface of the base film.

In the following, the method of the invention is described in detail with reference to the accompanying drawing.

Figure 1:
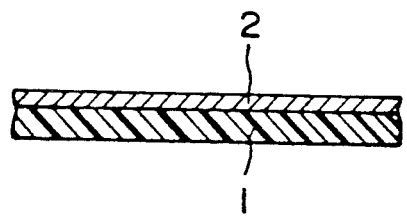
FIGS. 1 to 5 are for illustration of the successive steps in practicing the inventive method by way of the cross sectional view of the base film.
Figure 2:
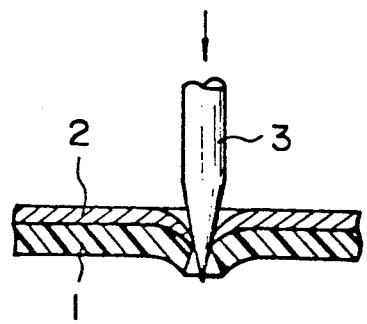
Figure 3:
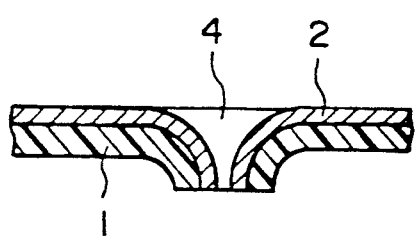
Figure 4:
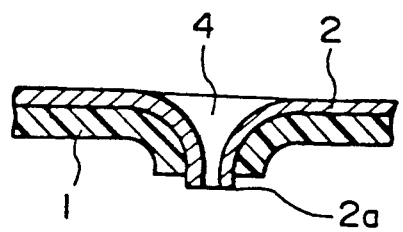
Figure 5:
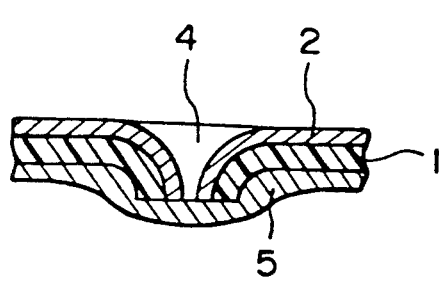

FIG. 1 illustrates a cross sectional view of a flexible base film 1, such as a polyester film, provided on one surface with a layer of an electric circuit pattern 2 having plastic deformability as formed from an electroconductive paste. The electroconductive plastically deformable layer of the first circuit pattern 2 preferably has a thickness in the range from 10 to 50 μm. As is illustrated in FIG. 2 by a cross section, a punching needle 3 is put on the conductive layer 2 of the circuit pattern and thrusted into the base film 1 to form an opening 4 as is illustrated in FIG. 3 (the needle not shown). The broken end portion of the conductive layer 2 now appears and is exposed on the opposite surface of the base film 1. When the needle 3 is further thrusted into the opening 4, the conductive layer 2 causes a plastic flow by the shearing force with the needle 3 so that the end portion 2a of the conductive layer 2 is protruded on the opposite surface of the base film 1 as is illustrated in FIG. 4. Thereafter, as is illustrated in FIG. 5, a second circuit pattern 5 is formed on the opposite surface of the base film 1, for example, by screen printing with an electroconductive pasty ink so that the electric connection between the first circuit pattern 2 and the second circuit pattern 5 can be established with reliability by means of the plastically deformed end portion of the conductive layer 2 of the first circuit pattern protruded out of the opening 4 and contacted with the conductive layer 5 of the second circuit pattern.

When the electroconductive paste used for forming the plastically deformable conductive layers 2, 5 is formulated with a thermosetting resin as the binder, the primary drying of the conductive layer 2 on the base film 1 as illustrated in FIG. 1 after the step (a) is performed at 80° to 150° C. in a hot-air circulating oven for 5 to 10 minutes or in a far-infrared drying oven for 30 to 120 seconds. The secondary drying after the second circuit pattern 5 has been formed as is illustrated in FIG. 5 is performed at 80° to 150° C. in a hot-air circulating oven for 0.5 to 2 hours or in a farinfrared drying oven for 2 to 30 minutes. The drying schedule naturally depends on the curing behavior of the thermosetting resin so that it is important that the thermosetting resin after the primary drying is in a semi-cured condition to ensure plastic deformation of the conductive layer 2 by punching but to minimize return of the once deformed layer to the undeformed state in the secondary drying in order to ensure most reliable electric connection between the first and the second circuit patterns 2,5.

The material of the punching needle 3 is not particularly limitative and need not be made of a material having a particularly high hardness. Ordinary steel needles can be used satisfactorily because the body into which the needle is thrusted is a polymeric material having a low hardness. The diameter of the needle 3 naturally depends on the diameter of the opening 4 as the desired through-hole and is usually in the range from 0.5 to 2 mm. When the diameter of the needle is too small, some difficulties are encountered in the mounting works of the needles on a punching die as well as a risk of possible bending or breaking of the needle with a so small diameter. When the diameter of the needle is too large, on the other hand, the opening made thereby also has a diameter which is too large relative to the fine density of the circuit patterns formed on the base film.

Figure 6:
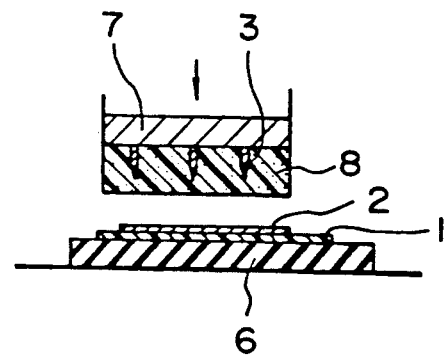
FIG. 6 illustrates an embodiment of the inventive method showing a base film on a rubber pad below a punching die holding punching needles.

FIG. 6 illustrates an assembly of the punching needles 3 and the base film 1 with a plastically deformable conductive layer 2 of the first circuit pattern on one surface. The base film 1 is mounted on a rubber pad 6 with the conductive layer 2 facing upwardly. A plural number of punching needles 3 are held by a die base 7 each at an appropriate position corresponding to the position of the opening to be made in the base film 1. It is usual that the punching needles 3 are covered by an elastomeric strike-out protector 8. When the die base 7 is pressed down against the base film 1, the point of each punching needle 3 penetrating the elastomeric strike-out protector 8 is thrusted into the conductive layer 2 and the base film 1 reaching the rubber pad 6 to make an opening 4. The rubber pad 6 should have a thickness of, preferably, 2 to 5 mm and the rubber has a hardness of 30 to 60 in the JIS A scale. When the hardness of the rubber pad 6 is too high, the plastic deformation of the base film 1 and hence the plastic flow of the conductive layer 2 take place only to an insufficient extent before an opening 4 is formed in the base film 1. When the hardness of the rubber pad 6 is too low, on the other hand, the end portion of the plastically deformed and broken base film 1 may be further deformed wider to cause some difficulties in conducting screen printing on the opposite surface for the second circuit pattern.

As is understood from the above given description, the invention provides a very reliable and highly productive method for the preparation of double-sided flexible circuit boards without the troublesome procedure in the prior art methods caused by the injection of an electroconductive paste or ink into openings formed in the base film because the electrical connection between the two circuit patterns on the surfaces of a base film can be obtained by the plastic deformation and protrusion of the plastically deformable conductive layer of the first circuit pattern on one surface which is contacted with the conductive layer of the second circuit pattern subsequently formed on the opposite surface of the base film followed by curing of the conductive layers to form a consolidated conductive path between the conductive layers.

What is claimed is:

1. A method for preparing a double-sided flexible circuit board with a through-hole which comprises the steps of:

(a) forming an electroconductive patterned layer of a first electric circuit on one surface of a flexible base film by printing with an electroconductive paste, comprising electroconductive particles and a thermosetting resin as a binder of the electroconductive particles, the layer of the circuit pattern formed on the base film being electrically conductive and plastically deformable;

(b) subjecting the electroconductive patterned layer of the first electric circuit formed of the electroconductive paste in step (a) to a heat treatment to bring it into a semi-cured condition;

(c) thrusting a punching needle into the conductive layer from the surface thereof to penetrate the base film forming an opening in the base film with plastic deformation thereof such that a portion of the plastically deformable layer of the first circuit pattern on the base film at the opening is exposed through the opening to a surface of the base film opposite to the first circuit pattern; and then (d) printing an electroconductive patterned layer of a second electric circuit on the surface of the base film opposite to the first circuit pattern with an electroconductive plastically deformable material so as to contact the conductive layer of the second circuit pattern with the conductive layer of the first circuit pattern at the portion exposed through the opening.

2. The method as claimed in claim 1 wherein the punching needle has a diameter in a range from 0.5 mm to 2 mm.

3. The method as claimed in claim 1 wherein the base film has a thickness in a range from 15 $\mu$m to 50 $\mu$m.

4. The method as claimed in claim 1 wherein the punching needle is thrusted into the base film in step (b) by putting the base film on a rubber pad having a thickness in a range from 2 mm to 5 mm.

5. The method as claimed in claim 4 wherein the rubber pad is made from a rubber having a hardness in a range from 30 to 60 in the JISA scale.

6. The method as claimed in claim 1 wherein the electroconductive patterned layer of the first electric circuit has a thickness in a range from 10 $\mu$m to 50 $\mu$m.

* * * * *